(12) United States Patent
Liu

(10) Patent No.: US 8,267,554 B2
(45) Date of Patent: Sep. 18, 2012

(54) LIGHT EMITTING DIODE DEVICE

(75) Inventor: Tianming Liu, Zhongshan (CN)

(73) Assignee: Qinghaun Sun, Zhongshan (CN)

( * ) Notice: Subject to any disclaimer, the term of this patent is extended or adjusted under 35 U.S.C. 154(b) by 200 days.

(21) Appl. No.: 12/626,257

(22) Filed: Nov. 25, 2009

(65) Prior Publication Data

US 2010/0134026 A1    Jun. 3, 2010

(30) Foreign Application Priority Data

Dec. 3, 2008  (CN) .................... 2008 2 0180490 U

(51) Int. Cl.
*F21V 15/00*   (2006.01)
*H05B 37/00*   (2006.01)

(52) U.S. Cl. ..... 362/362; 362/800; 362/812; 315/185 S; 315/205; 315/207; 315/200 R

(58) Field of Classification Search ............... 257/99, 257/79, 81, 82, 84, 100; 362/800–812; 315/49–59, 315/185 S
See application file for complete search history.

(56) References Cited

U.S. PATENT DOCUMENTS

| | | | | |
|---|---|---|---|---|
| 5,463,280 | A * | 10/1995 | Johnson | 315/187 |
| 6,472,688 | B2 * | 10/2002 | Miyata | 257/79 |
| 2006/0261362 | A1 * | 11/2006 | Noda et al. | 257/98 |
| 2011/0037397 | A1 * | 2/2011 | Lee et al. | 315/185 R |

* cited by examiner

*Primary Examiner* — Tuyet Thi Vo

(74) *Attorney, Agent, or Firm* — Reinhart Boerner Van Deuren P.C.

(57) ABSTRACT

A light emitting diode (LED) device comprises a base and a cover packaging of a rectifier diode chip and a light emitting diode chip connecting in series with a metal wire. The LED device can be plugged directly into the socket of the LED light string without any other external rectifier circuits. Moreover, the device has advantages of small size, easy-to-use and easy-to-change. By adopting different connection methods with the LED device, it can achieve anticipative functions, such as half-wave, full-wave and bridge rectifier, etc.

5 Claims, 2 Drawing Sheets

LIGHT EMITTING DIODE DEVICE

CROSS REFERENCE RELATED APPLICATIONS

This application claims priority to copending Chinese Patent Application No. 200820180490.8, filed Dec. 3, 2008, which is entirely incorporated herein by reference.

FIELD OF THE INVENTION

The present invention relates to a light emitting diode device. More particularly, the present invention relates to a light emitting diode device which can play the role of rectifier.

BACKGROUND OF THE INVENTION

Light emitting diodes (LEDs) are extensively used in lighting industry. Compared with little incandescent bulb and neon lamp, LED has the advantages of low working voltage (some even only require voltage a little higher than 1V), low working current (some can emit light under 1 A), excellent shock resistance ability, aseismic character, high reliability and long service life. Moreover, the LED can conveniently control the strength of emitting light by modulating the current.

Although the existing light emitting diodes in LED lights can emit light, they do not have the rectifier function. The user has to connect external circuits of rectifier diode or a rectifier diode inside the LED light before using. In practice, the scheme has its drawbacks such as complicated structure, numerous apparatus, excessive size and high price.

SUMMARY OF THE INVENTION

According to the drawbacks mentioned above, the object of the present invention is to provide an easy-to-use LED device which has small size with low cost and simple structure and can achieve different rectifier functions by different corresponding connections.

In order to achieve the object mentioned above, the embodiment of the present invention is:

A light emitting diode device comprises a base and a cover packaging of a rectifier diode chip and a light emitting diode chip connecting in series with a metal wire.

Wherein, said cover is made of epoxy resin.

Wherein, said light emitting diode chip can emit a source of light whose wavelength ranges from 380 nm to 1000 nm.

The present invention also provides an LED bridge rectifier controller comprising a plug, an LED light group, a bridge rectifier component and a resistance, wherein said bridge rectifier component consists of four said LED devices connected in bridge.

The present invention also provides an LED half-wave rectifier controller comprising a plug, an LED light group, a half-wave rectifier component and a resistance, wherein said half-wave rectifier component consists of one said LED device.

The present invention also provides an LED full-wave rectifier controller comprising a plug, an LED light group, a full-wave rectifier component and a resistance, wherein said full-wave rectifier component consists of two said LED devices.

Wherein, said LED light group comprises at least two light emitting diodes connecting in series.

The benefits of the LED device of the present invention are as follows:

1) With the said LED device, LED light does not need to connect an external rectifier diode. Furthermore, LED light can not only emit normally but also achieve the rectifier function at the same time.

2) The said LED device can be plugged directly into the socket of the LED light string without any other external rectifier circuits. The said LED device also has advantages of small size, easy-to-use and easy-to-change. It can achieve anticipative functions, such as half-wave, full-wave and bridge rectifier, by connecting different LEDs.

3) Because the said LED device comprises of a rectifier diode chip and a light emitting diode connected in series, the LED device can endure a reverse voltage 100 times higher than general LEDs.

BRIEF DESCRIPTION OF THE ACCOMPANYING DRAWINGS

DETAILED DESCRIPTION

The detailed description below refers to the accompanying drawings.

Figure 1:
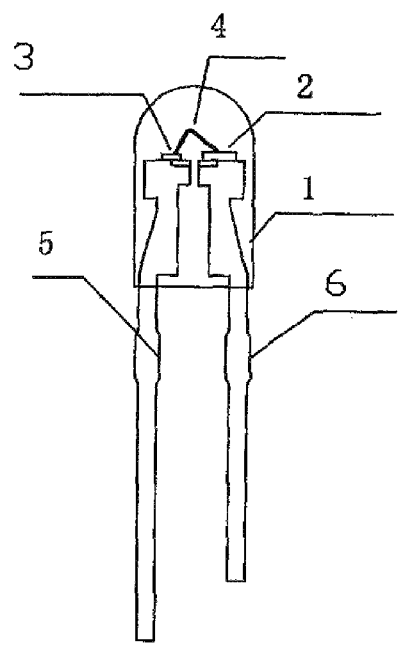
FIG. 1 illustrates a schematic view of the LED device of the invention.
Figure 5:
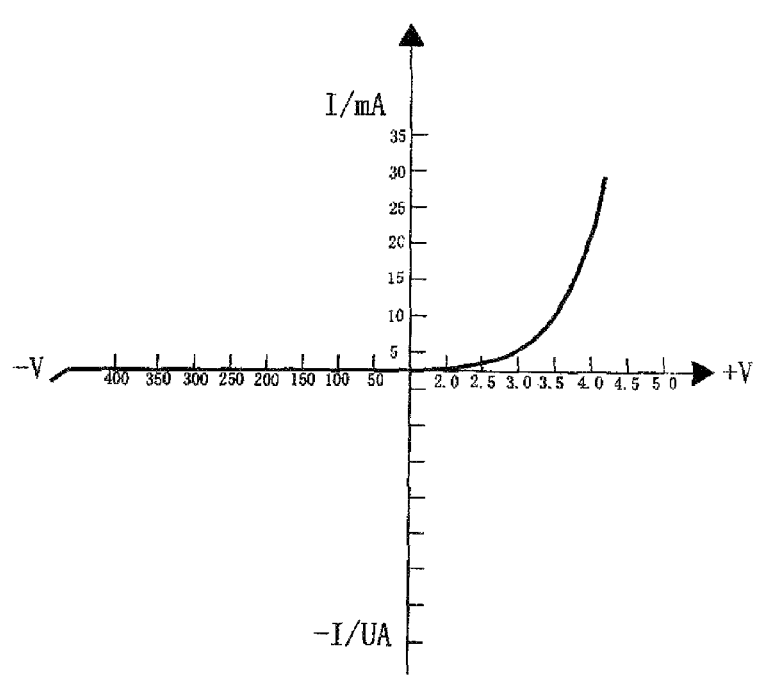
FIG. 5 illustrates the Volt-Ampere Characteristic curve of the LED device of the invention.

FIG. 1 is an LED device of the present invention, a combination device which integrates a rectifier diode based on the existing light emitting diode. The said LED device packages a rectifier diode chip 2 and a light emitting diode chip 3 inside cover 1, wherein said rectifier diode chip 2 connects in series with said light emitting diode chip 3 with a metal wire 4. Moreover, said rectifier diode chip 2 and said light emitting diode 3 are led out through base 5 and base 6 respectively. The said cover 1 of the present invention can be made of glass, metal or plastic. Here, as an instance, it is made of epoxy resin. The said light emitting diode chip 3 can emit a source of light whose wavelength ranges from 380 nm to 1000 nm. With the said LED device, LED light can not only emit normally but also achieve the rectifier function without connecting an external rectifier diode. Furthermore, applying a series-connected light emitting diode with a rectifier diode, the LED device of the present invention can endure a reverse voltage 100 times higher than general LED. FIG. 5 is the Volt-Ampere Characteristic curve of the LED device of the present invention and shows that the reverse breakdown voltage can be higher than 400V; the maximum reverse working voltage can be higher than 200V.

Figure 2:
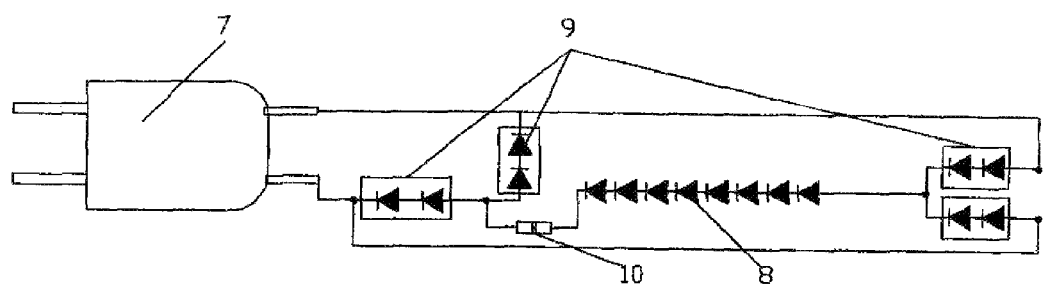
FIG. 2 illustrates the circuit diagram of the bridge rectifier controller of the invention.
Figure 3:
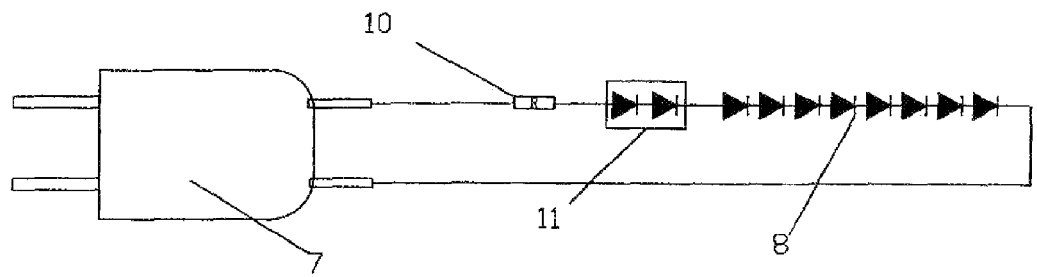
FIG. 3 illustrates the circuit diagram of the half-wave rectifier controller of the invention.
Figure 4:
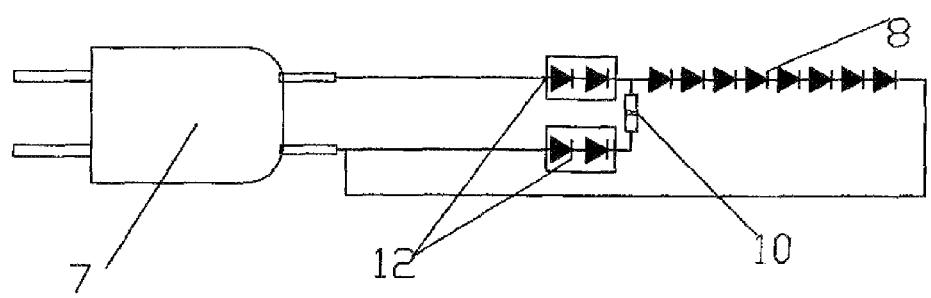
FIG. 4 illustrates the circuit diagram of the full-wave rectifier controller of the invention.

On the other hand, to achieve more functions, such as half-wave, full-wave and bridge rectifier, the said LED device can be applied in different connection methods. As the specific embodiments, FIG. 2, FIG. 3 and FIG. 4 show three kinds of controller formed by different circuits which employ corresponding connection methods with the said LED device, wherein said three controllers comprise a plug 7, an LED light group 8, a resistance 10 and respective rectifier circuits. The said controller in FIG. 2 applies a bridge rectifier circuit 9 to achieve the function of bridge rectifier. The said controller in FIG. 3 applies a half-wave rectifier circuit 11 to achieve the function of half-wave rectifier. The said controller in FIG. 4 applies a full-wave rectifier circuit 12 to achieve the function of full-wave rectifier. Therefore, the LED device of the present invention can accomplish both emitting and rectifying functions. The LED of the present invention can be plugged directly into the socket of the LED light string. Additionally, the LED of the present invention has the advantages of easy-to-use, easy-to-change, small size and convenient operation.

The embodiment described above is one instance of the present invention.

Furthermore, it is not intended that the scope of the claims appended hereto be limited in the description as set forth herein. Many modifications and variations might readily be made by skilled persons in the field according to the present invention, but such modifications and variations are intended to fall within the scope of claims of the present invention.

What is claimed is:

1. An LED half-wave rectifier controller comprising: a plug, an LED light group, a half-wave rectifier component and a resistance, wherein said half-wave rectifier component consists of one LED device, said LED device comprising: a base, a cover packaging of a rectifier diode chip and a light emitting diode chip, and a metal wire wherein said rectifier diode chip connects in series with said light emitting diode chip and said metal wire.

2. An LED full-wave rectifier controller as defined in claim 1, further comprising: a plug, an LED light group, a full-wave rectifier component and a resistance, wherein said full-wave rectifier component consists of two LED devices.

3. An LED bridge rectifier controller as defined in claim 1, wherein said LED light group comprises at least two light emitting diodes connected in series.

4. An LED half-wave rectifier controller as defined in claim 1, wherein said LED light group comprises at least two light emitting diodes connected in series.

5. An LED full-wave rectifier controller as defined in claim 1, wherein said LED light group comprises at least two light emitting diodes connected in series.

* * * * *

UNITED STATES PATENT AND TRADEMARK OFFICE
CERTIFICATE OF CORRECTION

PATENT NO. : 8,267,554 B2  Page 1 of 1
APPLICATION NO. : 12/626257
DATED : September 18, 2012
INVENTOR(S) : Tianming Liu It is certified that error appears in the above-identified patent and that said Letters Patent is hereby corrected as shown below:

On Title page, at (75) Inventor: Tianming Liu, add "City" after "Zhongshan";

On Title page, at (73) Assignee: replace "Qinghaun" with "Qinghuan"; and add "City" after "Zhongshan".

Signed and Sealed this
Twenty-seventh Day of November, 2012

David J. Kappos
*Director of the United States Patent and Trademark Office*